(12) United States Patent
Amir

(10) Patent No.: US 6,787,920 B2
(45) Date of Patent: Sep. 7, 2004

(54) ELECTRONIC CIRCUIT BOARD MANUFACTURING PROCESS AND ASSOCIATED APPARATUS

(75) Inventor: Dudi Amir, Portland, OR (US)

(73) Assignee: Intel Corporation, Santa Clara, CA (US)

(*) Notice: Subject to any disclaimer, the term of this patent is extended or adjusted under 35 U.S.C. 154(b) by 97 days.

(21) Appl. No.: 10/179,761

(22) Filed: Jun. 25, 2002

(65) Prior Publication Data
US 2003/0235044 A1 Dec. 25, 2003

(51) Int. Cl.[7] .............................. H01L 23/50; H05K 7/06
(52) U.S. Cl. .................. 257/778; 257/738; 257/786; 174/260; 361/777
(58) Field of Search .................. 174/260; 361/777, 361/783; 257/737, 738, 778, 773, 775, 786; 438/108; 228/180.22; 29/832, 840

(56) References Cited

U.S. PATENT DOCUMENTS

| | | | | |
|---|---|---|---|---|
| 4,836,435 A | * | 6/1989 | Napp et al. | 228/180.22 |
| 5,808,874 A | * | 9/1998 | Smith | 361/769 |
| 6,078,505 A | * | 6/2000 | Turudic | 361/760 |
| 6,084,782 A | * | 7/2000 | Huynh et al. | 361/777 |
| 6,137,062 A | * | 10/2000 | Zimmerman | 174/260 |
| 6,156,980 A | * | 12/2000 | Peugh et al. | 174/252 |
| 6,215,670 B1 | * | 4/2001 | Khandros | 361/774 |
| 6,346,679 B1 | * | 2/2002 | Nakamura | 174/260 |

\* cited by examiner

*Primary Examiner*—John B. Vigushin
(74) *Attorney, Agent, or Firm*—Blakely, Sokoloff, Taylor & Zafman LLP

(57) ABSTRACT

A carrier substrate comprising a non-conductive substrate, one or more conductive regions on, under or within the non-conductive substrate, and a plurality of pads, selectively coupled with the conductive regions, to receive and couple with conductive elements of a component, wherein at least one pad is configured to receive and couple with two or more conductive elements of the component.

12 Claims, 3 Drawing Sheets

ELECTRONIC CIRCUIT BOARD MANUFACTURING PROCESS AND ASSOCIATED APPARATUS

TECHNICAL FIELD

The invention relates to the field of electronics manufacturing. More particularly, the invention relates to an electronic circuit board manufacturing process and associated apparatus.

BACKGROUND

An electronic circuit board is a carrier substrate that has components attached to it. The carrier substrate, which can include a printed circuit board, is made of a non-conductive substrate, typically fiberglass, with conductive regions, typically metal planes, wells, and traces, on top of, below, or embedded within the non-conductive substrate to conduct electricity and electrical signals. Components that are attached to a carrier substrate can include resistors, capacitors, inductors, transistors, diodes, connectors, and integrated circuit chips.

Such components typically include external elements, e.g. pins, balls, etc., that provide an electrical and mechanical coupling between the component and the carrier substrate. More specifically, these conductive elements are typically soldered to pads, or contact points, on the carrier substrate.

In the assembly process, solder paste is placed on the pads of the carrier substrate by pushing the solder through apertures, or holes, in a stencil. After the solder paste has been placed on the pads of the carrier substrate, the components are placed on top of the solder paste. The assembled board is then passed through a reflow oven, or some other heat source, to cause the solder paste to melt. When the solder cools, it solidifies and forms an electrically conductive mechanical bond between the pads of the carrier substrate and the components.

FIG. 1 is a graphical illustration of a conventional pad layout on a conventional carrier substrate. As shown, carrier substrate 100 includes a series of rows (104) and columns (102) of pads, e.g., 106, 108, 110, and 112, some of which are electrically coupled with one another through conductive planes, e.g., 114, 116, and 118. In this example, the pads reside in straight rows and columns, and each pad is positioned to align with corresponding conductive elements (pins, balls, etc.) of the particular integrated circuit chip. The pads that reside on a particular conductive plane are designed to conduct the same electrical voltage as the other pads on that same copper plane. For example, pads 108, 110, and 112 are each configured to couple conductive elements of the integrated circuit chip with the voltage of conductive plane 114. The pads that do not reside on a conductive plane, pad 106 for example, are designed to conduct dedicated signals.

FIG. 2 is a graphical illustration of a conventional solder stencil for use in applying solder paste to the carrier substrate of FIG. 1. As shown, stencil 200 includes a plurality of apertures, including apertures 202, 204, 206, and 208, through which solder paste can be selectively applied to the pads of the carrier substrate 100. Solder paste that is forced through aperture 202 is designed to collect on pad 106. One skilled in the art would appreciate that the aperture size must be sufficiently large so as to allow for solder paste to move through the aperture.

Problems with assembling electronic circuit boards generally increase as the distance between conductive elements of the component, referred to as the pitch, decreases. A major problem that can occur is bridging. Bridging is a situation where the solder paste has reflowed in a manner that couples two or more conductive elements of a component together. As pads are placed closer together to receive components with a finer pitch, the distance that solder has to move to create a bridge decreases and the likelihood of a bridge occurring increases.

BRIEF DESCRIPTION OF THE DRAWINGS

Embodiments of the invention are illustrated by way of example, and not by way of limitation in the figures of the accompanying drawings in which like reference numerals refer to similar elements.

DETAILED DESCRIPTION

An electronic circuit board manufacturing process and associated apparatus are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
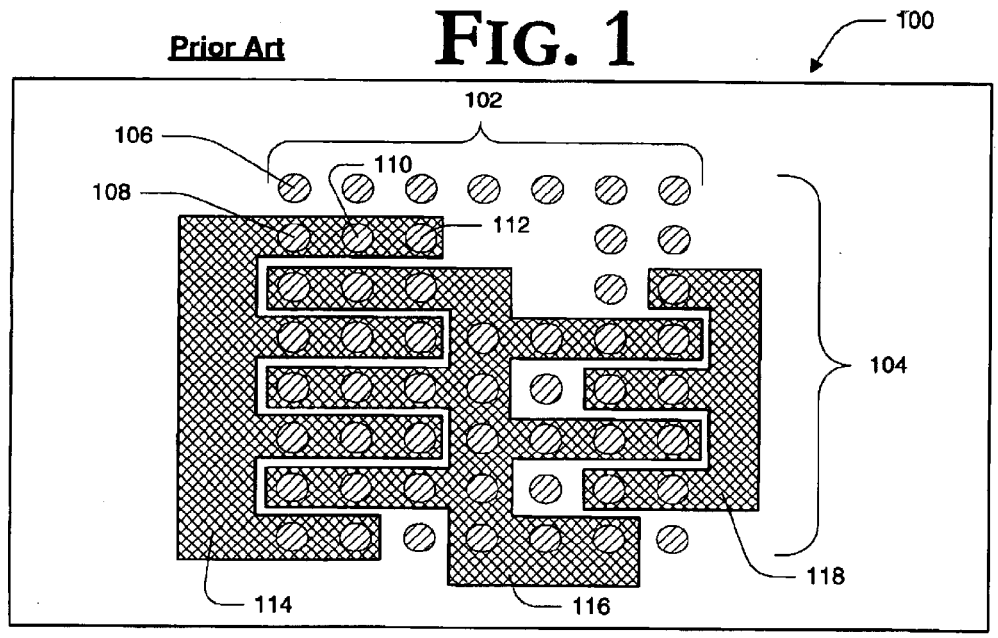
FIG. 1 is a graphical illustration of a conventional pad layout on a carrier substrate.
Figure 2:
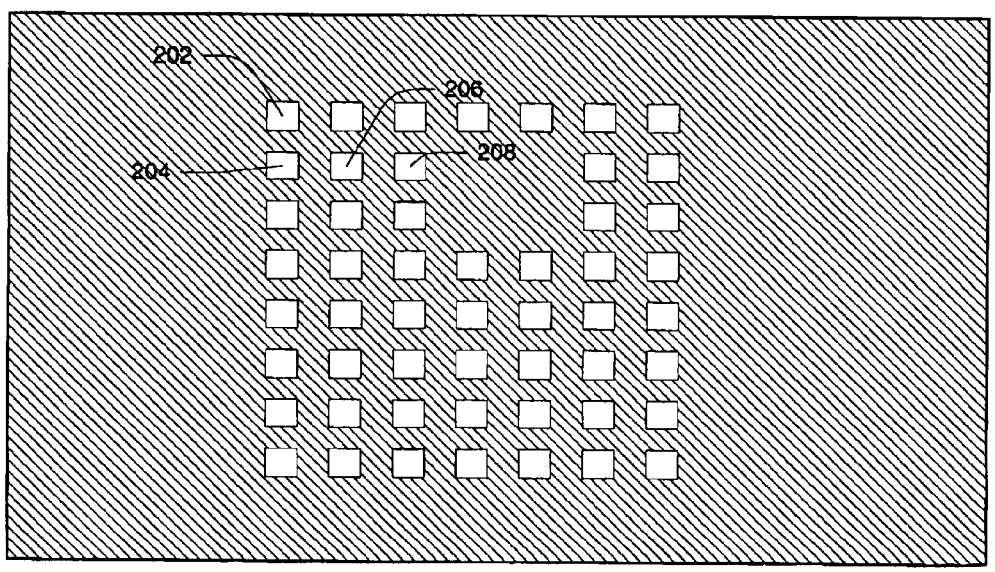
FIG. 2 is a graphical illustration of a conventional solder stencil suitable for use with the carrier substrate of FIG. 1.
Figure 3:
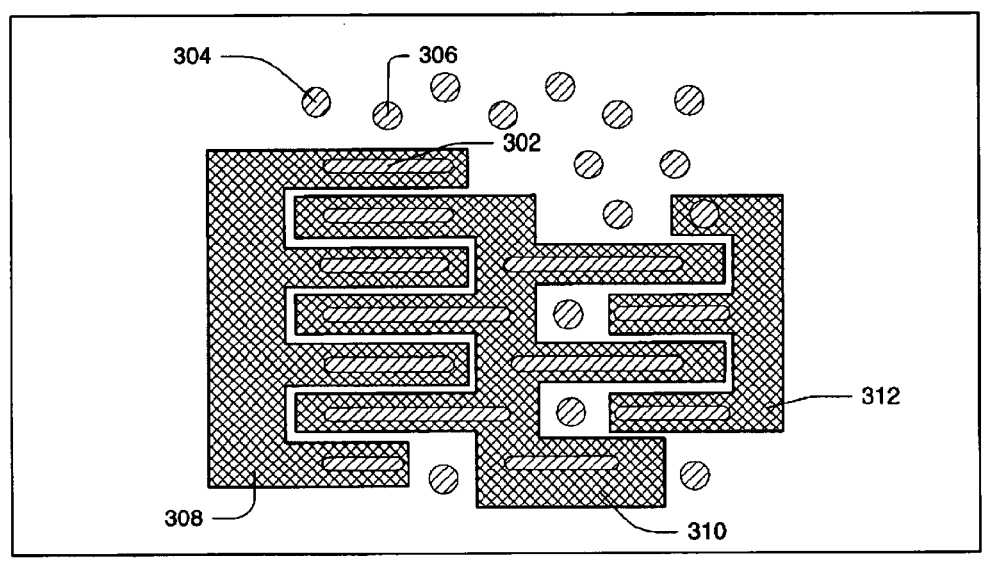
FIG. 3 is a graphical illustration of a pad layout on a carrier substrate, according to one example embodiment of the teachings of the present invention.

FIG. 3 is a graphical illustration of a pad layout on a carrier substrate, according to one example embodiment of the teachings of the present invention. As shown, carrier substrate 300 includes a series of pads, e.g., 302, 304, and 306, some of which are electrically coupled with one another through conductive planes, e.g., 308, 310, and 312. Carrier substrate 300 is designed to receive the same integrated circuit chip as carrier substrate 100. However, carrier substrate 300 deviates from carrier substrate 100 in at least two respects.

First, pad layout 300 comprises pads that are intentionally designed to create a bridge between conductive elements to a common voltage. Pad 302, for example, is designed to bridge the three conductive elements of the integrated circuit chip that were to couple with pads 108, 110, and 112 of carrier substrate 100. Pad 302 is electrically coupled with conductive plane 308. Conductive plane 308 may conduct an input voltage (a voltage to the integrated circuit chip), an output voltage (a voltage from the integrated circuit chip), or a ground voltage.

Another distinction between carrier substrate 300 and the conventional carrier substrate 100 is that carrier substrate 300 contains pads for signal connections that are physically offset from the location of the corresponding pads in carrier substrate 100. If the integrated circuit chip were placed on carrier substrate 100, the center (or middle) of each ball would contact the center of the corresponding pad. In contrast, if the integrated circuit chip were placed on carrier substrate 300, the center of some balls would contact the a portion other than the center of the corresponding pad. The offset of pads in carrier substrate 300 increases the effective distance between the centers of adjacent pads. This in turn decreases the likelihood of unintentional bridging between adjacent conductive elements of the integrated circuit chip. With an integrated circuit chip that is 0.5 mm pitch, the distance between pads can increase to approximately 0.65 mm. Another benefit of the offset of pads in carrier substrate 300 is higher yields (percentage of acceptable parts) in manufacturing the carrier substrate, because there is less of a chance that the pads will be unintentionally formed in contact with one another.

Figure 4:
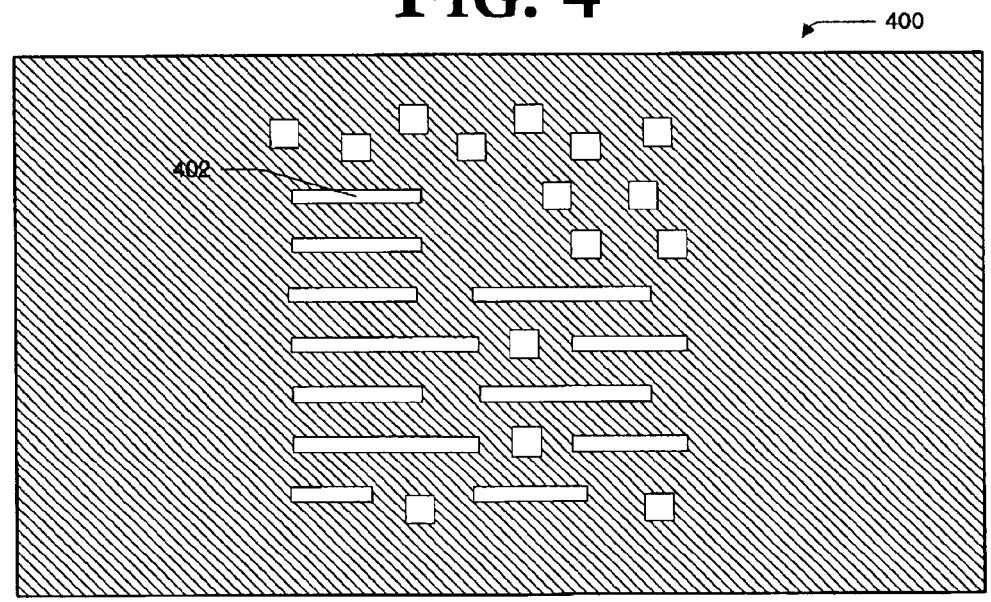
FIG. 4 is a graphical illustration of a solder stencil suitable for use with the carrier substrate of FIG. 3, according to one example embodiment of the teachings of the present invention.

FIG. 4 is a graphical illustration of a solder stencil suitable for use with the carrier substrate of FIG. 3, according to one example embodiment of the teachings of the present invention. As shown, the apertures of stencil 400 are designed to allow solder paste to be placed on the pads of carrier substrate 300. Aperture 402, for example, is designed to allow a grouping of solder paste to be placed on pad 302. Aperture 402 can be made narrower than aperture 202 while still exceeding the minimum necessary aperture size, because aperture 402 is longer than aperture 202. The narrowing of aperture 402 further increases the distance between adjacent apertures and further decreases the likelihood of an unintentional bridging between adjacent conductive elements of the integrated circuit chip. As used herein, the length of aperture 402 need only extend from approximately the middle of aperture 204 as in stencil 200 to approximately the middle of aperture 208 as in stencil 200.

Figure 5:
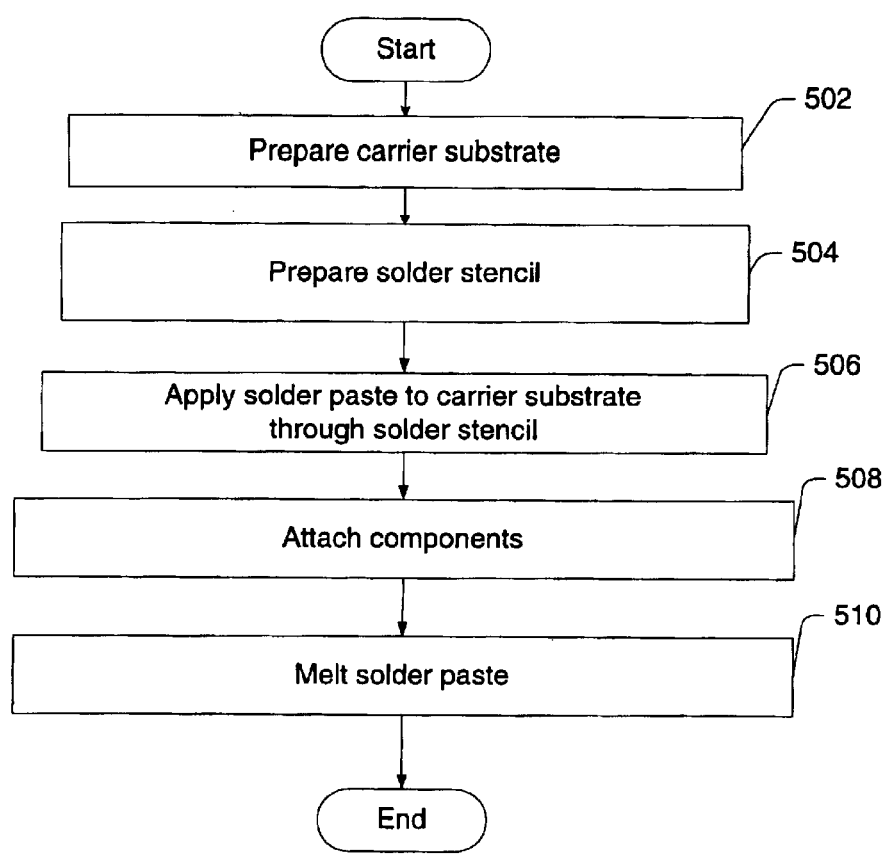
FIG. 5 is a flow chart of an example method of processing a carrier substrate, according to one example embodiment of the teachings of the present invention.

FIG. 5 is a flow chart of an example method of processing a carrier substrate, according to one example embodiment of the teachings of the present invention. A carrier substrate is prepared (502) that has a pad layout similar to that of carrier substrate 300. A solder stencil is then prepared (504) which has apertures similar to that of solder stencil 400. The stencil is placed on the carrier substrate and solder paste is applied (506) to the carrier substrate through the apertures of the solder stencil. The stencil is removed from the carrier substrate and components are placed on the carrier substrate (508) so that the conductive elements of the components are in contact with the groupings of solder paste. This assembly is then heated (510) to allow the solder paste to melt and then when it cools the solder forms an electrically conductive mechanical bond between the pads of the carrier substrate and the conductive elements of the component. The product that results from attaching components to a carrier substrate is referred to as an electronic circuit board. The electronic circuit board is then typically incorporated into a computing device. Utilizing a carrier substrate that has a pad layout similar to that of carrier substrate 300 and a solder stencil that has apertures similar to that of solder stencil 400 increases electronic circuit board assembly yields without changing assembly technology or processes.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A carrier substrate comprising:

a non-conductive substrate;

one or more conductive regions on, under or within the non-conductive substrate; and a plurality of pads, selectively coupled with the conductive regions, to receive and couple with balls of an integrated circuit chip, wherein at least one pad is configured to receive and couple with two or more balls of the integrated circuit chip, and is longer and narrower than the pad(s) configured to receive and couple with only one ball of the integrated circuit chip.

2. The carrier substrate of claim 1 wherein the at least one pad configured to couple with two or more balls of the integrated circuit chip is further coupled with a ground plane.

3. The carrier substrate of claim 1 wherein the at least one pad configured to couple with two or more balls of the integrated circuit chip is further coupled with an input voltage plane.

4. The carrier substrate of claim 1 wherein the at least one pad configured to couple with two or more balls of the integrated circuit chip is further coupled with an output voltage plane.

5. The carrier substrate of claim 1 wherein a distance between the pads is approximately 0.65 mm and a distance between the balls of the integrated circuit chip is approximately 0.5 mm.

6. The carrier substrate of claim 1 further comprising at least one pad that is offset a distance horizontally and/or vertically from a center position of the ball of the integrated circuit chip with which the pad is configured to be coupled.

7. An electronic circuit board comprising:

a non-conductive substrate;

one or more conductive regions on or within the non-conductive substrate;

a plurality of pads, selectively coupled with the conductive region(s); and one or more integrated circuit chip coupled with the pads, wherein two or more balls of the integrated circuit chip are coupled with a single pad that is longer and narrower than the pad(s) coupled with only one ball of the integrated circuit chip.

8. The electronic circuit board of claim 7 wherein the pad coupled with two or more balls of the integrated circuit chip is further coupled with a ground plane.

9. The electronic circuit board of claim 7 wherein the pad coupled with two or more balls of the integrated circuit chip is further coupled with an input voltage plane.

10. The electronic circuit board of claim 7 wherein the pad coupled with two or more balls of the integrated circuit chip is further coupled with an output voltage plane.

11. The electronic circuit board of claim 7 wherein a distance between centers of the pads is approximately 0.65 mm and a distance between centers of the balls of the integrated circuit chip is approximately 0.5 mm.

12. The electronic circuit board of claim 7 further comprising at least one pad that is offset a distance horizontally and/or vertically from a center position of the ball of the integrated circuit chip with which the pad is coupled.

* * * * *